(12) United States Patent
Natori

(10) Patent No.: US 6,919,581 B2
(45) Date of Patent: Jul. 19, 2005

(54) IMAGE DISPLAY UNIT AND PRODUCTION METHOD THEREOF

(75) Inventor: Takehisa Natori, Kanagawa (JP)

(73) Assignee: Sony Corporation, Tokyo (JP)

( * ) Notice: Subject to any disclaimer, the term of this patent is extended or adjusted under 35 U.S.C. 154(b) by 49 days.

(21) Appl. No.: 10/459,265

(22) Filed: Jun. 11, 2003

(65) Prior Publication Data

US 2004/0027314 A1 Feb. 12, 2004

Related U.S. Application Data

(62) Division of application No. 09/928,681, filed on Aug. 13, 2001, now Pat. No. 6,863,584.

(30) Foreign Application Priority Data

Aug. 18, 2000 (JP) ........................................ 2000-248544

(51) Int. Cl.[7] .............................................. H01L 21/00
(52) U.S. Cl. ............................ 257/72; 257/13; 257/99; 362/304
(58) Field of Search ............................ 257/72, 13, 99, 257/500; 362/223, 23, 31, 304; 445/3, 24; 313/498, 495

(56) References Cited

U.S. PATENT DOCUMENTS

| 3,612,955 A | * | 10/1971 | Butherus et al. | ............ | 361/779 |
| 3,868,759 A | * | 3/1975 | Hartleroad et al. | ............ | 29/464 |
| 4,186,394 A | * | 1/1980 | Bobak et al. | ................. | 345/55 |

(Continued)

FOREIGN PATENT DOCUMENTS

| EP | 0151508 | | 8/1985 | | |
| EP | 0466097 A | * | 9/1991 | ............. | G09F/9/37 |
| JP | 56-017385 | | 2/1981 | | |
| JP | 357007983 A | * | 1/1982 | ........... | H01L/33/00 |
| JP | 60-181778 | | 9/1985 | | |
| JP | 05206204 A | * | 8/1993 | ........... | H01L/21/60 |
| JP | 07-263754 | | 11/1995 | | |
| JP | 10-305620 | | 11/1998 | | |
| JP | 11-142878 | | 5/1999 | | |
| JP | 11142878 A | * | 5/1999 | ........... | G02F/1/136 |
| JP | 2002062825 A | * | 2/2002 | ............. | G09F/9/33 |

OTHER PUBLICATIONS

Shimizu, "Formation of Display Transistor Array Panel," JP 11-142878, machine translation from JPO website.*

Primary Examiner—Laura M. Schillinger
(74) Attorney, Agent, or Firm—Sonnenschein, Nath & Rosenthal LLP

(57) ABSTRACT

A method of producing an image display unit includes the steps of: forming, on a wafer, a display element layer composed of display elements arrayed on a specific cycle and provided with a magnetic film, and separating the display element layer into the individual display elements with magnetic film portions while keeping the array of the display elements; selecting, of all of the display elements, those located discretely at specific intervals of a value equivalent to an integer-fold of the specific cycle, and magnetizing the magnetic film portions provided on the selected display elements in such a manner that the magnetic film portions provided on the selected display units are magnetically distinguishable from the magnetic film portions provided on the non-selected display elements; and magnetically attracting the selected display elements while keeping the specific intervals thereof, and transferring the selected display elements onto a mounting board. The method may further include the step of repeating the selective magnetization step and the mounting step, to array all of the display elements at the specific intervals on the mounting board. With this method, the handling of fine LED pellets can be improved.

7 Claims, 7 Drawing Sheets

U.S. PATENT DOCUMENTS

| | | | |
|---|---|---|---|
| 5,206,749 A | * 4/1993 | Zavracky et al. | 349/45 |
| 5,258,320 A | * 11/1993 | Zavracky et al. | 438/27 |
| 5,438,241 A | 8/1995 | Zavracky et al. | 315/169 |
| 5,526,016 A | * 6/1996 | Nakagiri et al. | 345/111 |
| 5,627,563 A | * 5/1997 | Nakagiri et al. | 345/111 |
| 5,657,207 A | * 8/1997 | Schreiber et al. | 361/774 |
| 6,049,974 A | * 4/2000 | Asanasavest | 29/832 |
| 6,369,806 B1 | * 4/2002 | Endo et al. | 345/174 |
| 6,520,819 B1 | * 2/2003 | Sakaguchi | 445/24 |
| 6,683,416 B1 | * 1/2004 | Oohata et al. | 315/169.3 |
| 6,788,541 B1 | * 9/2004 | Hsiung | 361/719 |
| 6,863,584 B2 | * 3/2005 | Natori | 445/3 |
| 2002/0043923 A1 | * 4/2002 | Natori | 313/495 |
| 2004/0027314 A1 | * 2/2004 | Natori | 345/30 |

* cited by examiner

IMAGE DISPLAY UNIT AND PRODUCTION METHOD THEREOF

RELATED APPLICATION DATA

This application is a divisional of application Ser. No. 09/928,681 filed Aug. 13, 2001 now U.S. Pat. No. 6,863,584, which is incorporated herein by reference to the extent permitted by law. The present and foregoing applications claim priority to Japanese Application No. 2000-248544 filed Aug. 18, 2000.

BACKGROUND OF THE INVENTION

The present invention relates to an image display unit and a production method thereof, and particularly to a technique of producing an image display unit including display elements such as LED pellets arrayed in a matrix pattern.

FIG. 7A is a schematic perspective view showing one example of a related art image display unit used for flat TV sets. Wiring portions 8 and extraction electrodes 8a for external connection are formed on the surface of an alumina board 7. The surface of the alumina board 7, excluding the wiring portions 8 and the extraction electrodes 8a, is covered with a black resin. Part of each wiring portion 8 is taken as a pad electrode on which an LED (Light Emitting Diode) pellet is fixed. Pad electrodes are formed on top surfaces of the LEDs and are electrically connected to the extraction electrodes 8a via fine wires 20.

FIG. 7B is a schematic partial sectional view of the image display unit shown in FIG. 7A. As shown in this figure, the LED pellets are connected, by die bonding, to the wiring portions 8 on the alumina board 7. The surface of the alumina board 7, excluding the wiring portions 8, is covered with the black resin 23. Each LED pellet has a P-N junction layer. The pad electrode 22 is formed on the top surface of the LED pellet. The pad electrodes 22 are electrically connected to the extraction electrodes 8a by wire bonding using the fine wires 20. When a current is supplied to each LED pellet with the pad electrode 22 side taken as the positive side and the wiring portion 8 side taken as the negative side, light is emitted from the P-N junction layer of the LED pellet, to obtain a desired image display.

Image display units using LEDs (Light Emitting Diodes) as display elements are classified into outdoor type units and indoor type units. In particular, indoor type units have a COB (Chip On Board) structure as shown in FIGS. 7A and 7B, in which semiconductor chips are directly mounted on a board. Image display units, each having a pixel pitch ranging from 2.5 mm to 8 mm, have been commercially available. A semiconductor chip (LED pellet) has a size of about 0.3 mm×0.3 mm. As a result, in case of producing a color image display unit having an array configuration that red semiconductor chips, green semiconductor chips, and blue semiconductor chips are arrayed in a delta pattern, the pixel pitch exceeds 1 mm.

On the other hand, a ratio of the cost required for producing semiconductor chips to the total cost required for producing an image display unit is relatively high. Accordingly, in comparison of a small-sized display unit with a large-sized display unit, if the total number of pixels of the small-sized display unit is equal to that of the pixels of the large-sized display unit, the production cost of the small-sized display unit is not different from the production cost of the large-sized display unit so much. This means that the small-sized display unit is comparatively expensive in consideration of its screen size smaller than that of the large-sized display unit. Accordingly, the demand to reduce the production cost of the small-sized display unit is stronger than the demand to reduce the production cost of the large-sized display unit.

By the way, the pixel pitch can be reduced by reducing the size of each semiconductor chip. This leads to a possibility of a reduction in production cost of a micro-display unit. The reduction in size of each semiconductor chip, however, has a problem that the handling thereof becomes difficult and thereby the production cost is raised. For example, in case of handling a semiconductor chip with a vacuum chuck, the size of the vacuum chuck must be reduced along with the reduction in size of the chip, with a result that it is difficult to prepare a handling jig, to raise the production cost.

Various method of rationalizing the handling of LED pellets have been proposed. One method, disclosed in Japanese Patent Laid-open No. Sho 56-17385, is shown in FIGS. 8A to 8E.

Referring first to FIG. 8A, an LED wafer 1, on which a p-n junction layer and electrodes (not shown) are previously formed, is stuck on a temporary board 4 made from polyvinyl chloride to which an acrylic adhesive is previously applied.

Referring to FIG. 8B, the wafer 1 is separated into individual LED pellets by a dicing machine using a diamond blade. Since the dicing machine can cut the wafer on an accurate cycle, the individually separated LED pellets are kept in a state being orderly arrayed on the temporary board 4.

Referring to FIG. 8C, the LED pellets are transferred onto a second temporary board 6. The second temporary board 6 is also formed of a sticky sheet made from polyvinyl chloride to which an acrylic adhesive is previously applied, and accordingly, the LED pellets can be easily transferred onto the second temporary board 6. Subsequently, a conductive paste 30 is applied to selected LED pellets, for example, by screen printing.

Referring to FIG. 8D, the temporary board 6, on which the LED pellets are left stuck, is overlapped to a mounting board 7 made from ceramic or glass fiber reinforced epoxy resin on which die pads 8 are previously formed, whereby the LED pellets facing to the die pads 8 are transferred from the temporary board 6 to the mounting board 7.

Referring to FIG. 8E, the LED pellets thus transferred on the mounting board 7 are fixed thereto by the conductive paste 30. In accordance with such a method, fine LED pellets can be orderly arrayed at specific intervals on the mounting board 7.

In case of producing a high definition color image display unit, the pixel pitch is required to be reduced to a value equal to or less than 1 mm, and in this case, the size of each semiconductor chip must be reduced to a value equal to or less than 0.1 mm. It is difficult to handle such fine chips by the above-described related art method shown in FIGS. 8A to 8E. The related art method characterized by selectively applying a conductive paste on LEDs by screen printing has, if the size of pellets to be handled become fine, a limitation in terms of printing accuracy and also has a limitation in terms of accurate handling because of the use of the conductive paste which is in a fluid state.

SUMMARY OF THE INVENTION

The object of the present invention is to provide a method of producing an image display unit, which is capable of improving the handling of fine LED pellets and which is suitable for producing a image display unit of high definition.

To achieve the above object, according to the present invention, there is provided a method of producing an image display unit, including: an element formation step of forming, on a wafer, a display element layer composed of display elements arrayed on a specific cycle and provided with a magnetic film, and separating the display element layer into the individual display elements with magnetic film-portions individually separated from the magnetic film while keeping the array of the display elements; a selective magnetization step of selecting, of all of the display elements, those located discretely at specific intervals of a value equivalent to an integer-fold of the specific cycle, and magnetizing the magnetic film portions provided on the selected display elements in such a manner that the magnetic film portions provided on the selected display units are magnetically distinguishable from the magnetic film portions provided on the non-selected display elements; and a mounting step of magnetically attracting the selected display elements while keeping the specific intervals thereof, and transferring the selected display elements onto a mounting board. The production method preferably further includes the step of repeating the selective magnetization step and the mounting step, to array all of the display elements at the specific intervals on the mounting board.

The selective magnetization step preferably includes the step of magnetizing the magnetic film portions on all of the display elements in one direction, and re-magnetizing the magnetic film portions on the selected display elements in the opposed direction.

The mounting step preferably includes the step of magnetically attracting only the selected display elements by using an electric magnet.

The element formation step preferably includes the step of forming, on the wafer, the display elements which are composed of light emitting diodes located on the front surface sides taken as light emitting sides, and forming the magnetic film on the back surface sides of the display elements.

The element formation step preferably further includes the step of forming a magnetic film even on portions, not obstructing light emission, of the front surfaces of the light emitting diodes, and magnetically connecting magnetic film portions individually separated from the magnetic film formed on the front surface sides of the light emitting diodes to the magnetic film portions formed on the back surface sides of the display elements.

The mounting step preferably further includes the step of eliminating, after arraying the display elements on the mounting board, the magnetization of the magnetic film portions on the display elements.

With these configurations, since fine display elements are transferred from the wafer side to the mounting board side by making use of a magnetic attraction force, the mounting accuracy and the mounting efficiency of the fine display elements can be improved.

DETAILED DESCRIPTION OF THE PREFERRED EMBODIMENTS

Hereinafter, preferred embodiments of the present invention will be described with reference to the drawings.

FIGS. 1A to 1H are views illustrating process steps of producing an image display unit according to the present invention.

Figure 1A:
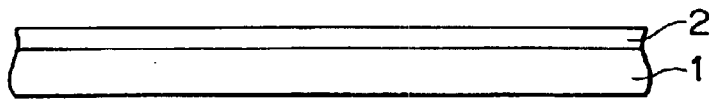
FIGS. 1A to 1H are views illustrating process steps of producing an image display unit according to the present invention.

Referring to FIG. 1A, a semiconductor layer is formed on a wafer 1 composed of a sapphire substrate by using an epitaxial technique. In this embodiment, since LEDs are used as display elements, a PN-junction layer 2 is formed on the wafer 1 by epitaxial growth. It is to be noted that the present invention is not limited to the LEDs but may be applied to other display elements usable for pixels of image display units. In addition, the display elements may contain drive circuits such as transistors, resistors, capacitors, or diodes.

Figure 1B:
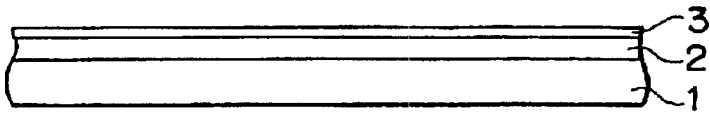

Referring to FIG. 1B, a magnetic film 3 is formed on the overall surface of the PN-junction layer 2 by sputtering or the like. In this embodiment, Ni is formed by sputtering.

Figure 1C:
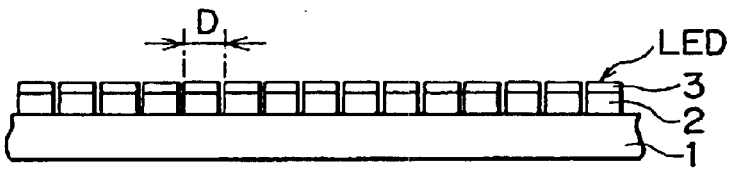

Referring to FIG. 1C, the stack of the PN-junction layer 2 and the magnetic film 3 is diced into individual LED pellets (display elements). While not shown, in addition to the PN-junction layer 2 and the magnetic film 3, electrodes necessary for electric connection and the like are formed on the LED pellets by photolithography and etching. According to the above-described element formation step, the display element layer, which is composed of the display elements arrayed on a specific cycle D and is provided with the magnetic film 3, is formed on the wafer 1, and is separated into the individual display elements with magnetic film portions individually separated from the magnetic film 3 while the array of the display element is kept. In addition, according to the element formation step, an LED (Light Emitting Diode) is formed on the front surface taken as the light emitting side of each display element, and the magnetic film portion 3 is provided on the back surface of the display element. If needed, a magnetic film may be formed on portions, not obstructing light emission, of the front surfaces of the LEDs (light emitting diodes), and magnetic film portions individually separated from the magnetic film formed on the front surface sides of the LEDs may be magnetically connected to the magnetic film portions 3 on the back surface sides of the display elements. This additional provision of the magnetic film on the front surface sides of the LEDs allows a magnetic attraction force to more positively act on the LEDs.

Figure 1D:
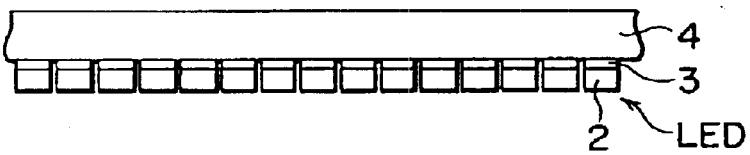

Referring to FIG. 1D, the array of the LEDs separated from each other by dicing are once transferred from the wafer 1 onto a temporary board 4. To be more specific, the temporary board 4 made from a resin film including an adhesive layer is overlapped to the wafer 1, and the wafer 1 is overall irradiated, from the back surface side of the wafer 1, with laser beams, to flake the joined plane between the LEDs and the wafer 1, whereby the LEDs are transferred onto the temporary board 4 via the adhesive layer.

Figure 1E:
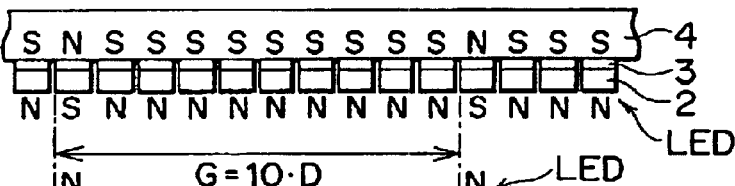

Referring to FIG. 1E, of the LEDs arrayed on the specific cycle D, those located discretely at specific intervals of a value G equivalent to an integer-fold (ten-fold in this embodiment) of the specific cycle D, (that is, at specific intervals of a value G=10×D in this embodiment) are selected, and the magnetic film portions 3 provided on the selected LEDs are magnetized in such a manner as to be magnetically distinguishable from the magnetic film portions 3 provided on the non-selected LEDs. In this embodiment, each of the selected LEDs is magnetized in the upward direction with the lower side taken as the S-pole and the upper side taken as the N-pole, while each of the non-selected LEDs is magnetized in the downward direction with the upper side taken as the S-pole and the lower side taken the an N-pole. In this selective magnetization step, the magnetic film portions 3 provided on all of the LEDs are magnetized in one direction (downward direction), and then the magnetic film portions 3 provided on the selected LEDs are re-magnetized in the opposed direction (upward direction).

Figure 1F:
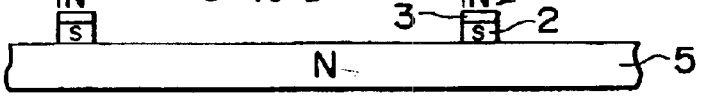

Referring to FIG. 1F, by applying a magnetic force to the array of the selectively magnetized LEDs via a permalloy board 5, only the selectively magnetized LEDs are attracted to the permalloy board 5. To be more specific, by taking the permalloy board 5 side as the N-pole, the S-pole sides of the selected LEDs are attracted to the permalloy board 5. In this case, since the N-pole sides of the non-selected LEDs face to the permalloy board 5, the non-selected LEDs are not attracted to the permalloy board 5 because of a magnetic repulsive force acting therebetween.

Figure 1G:
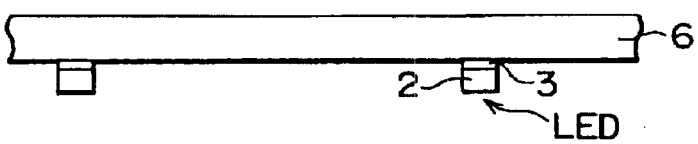

Referring to FIG. 1G, the selected LEDs are transferred to a temporary board 6 side while the intervals of G=10×D is kept.

Figure 1H:
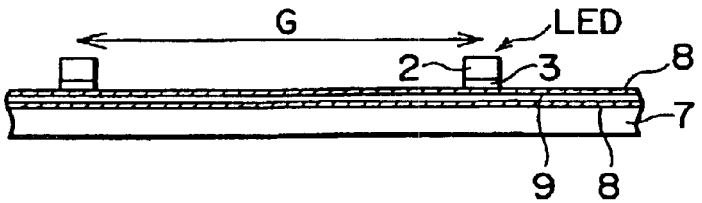

Referring to FIG. 1H, the selected LEDs are transferred from the temporary board 6 side to a mounting board 7 side. Multiple wiring layers 8 are previously formed on the mounting board 7. Adjacent two stacked in the vertical direction of the wiring layers 8 are separated from each other via an insulating layer 9. In addition, the transfer of the selected LEDs from the state shown in FIG. 1G to the state shown in FIG. 1H is actually repeated twice, so that the magnetic film portions 3 provided on the back surface sides of the selected LEDs are joined to the mounting board 7. As a result, the LEDs mounted on the mounting board 7 can emit light from the front surface sides thereof. As described above, in this mounting step, only the selected LEDs are magnetically attracted with the specific intervals of G=10×D kept by using an electric magnet, to be thus transferred onto the mounting board 7.

The steps from the selective magnetization step FIG. 1E to the mounting step FIG. 1H are repeated until all of the LEDs are arrayed on the overall surface of the mounting board 7 at specific intervals of G=10×D. An image display unit is thus accomplished.

As is apparent from the comparison between the states shown in FIGS. 1C and 1H, the fine LEDs can be accurately re-arrayed on the mounting board 7 at the arrangement intervals of the value G equivalent to the integer-fold of the arrangement cycle D of the LEDs. In the mounting step, after the LEDs are arrayed on the mounting board 7, the magnetization of the magnetic film portions 3 provided on the LEDs may be eliminated. The demagnetization may be performed, for example, by applying an AC magnetic field to the magnetic film portions 3.

Figure 2A:
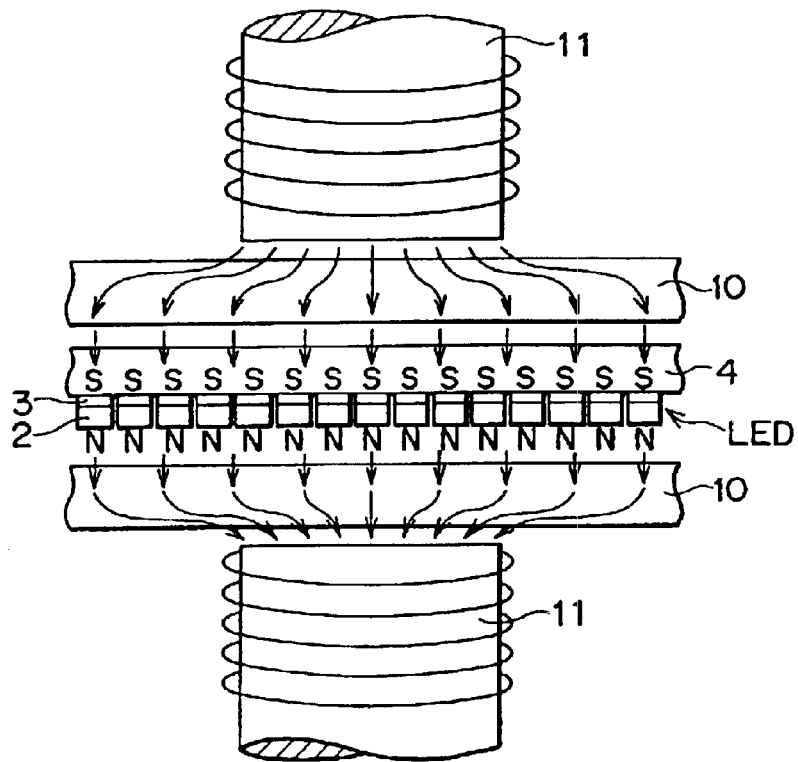
FIGS. 2A and 2B are views illustrating the selective magnetization step shown in FIGS. 1A to 1H in detail.
Figure 2B:
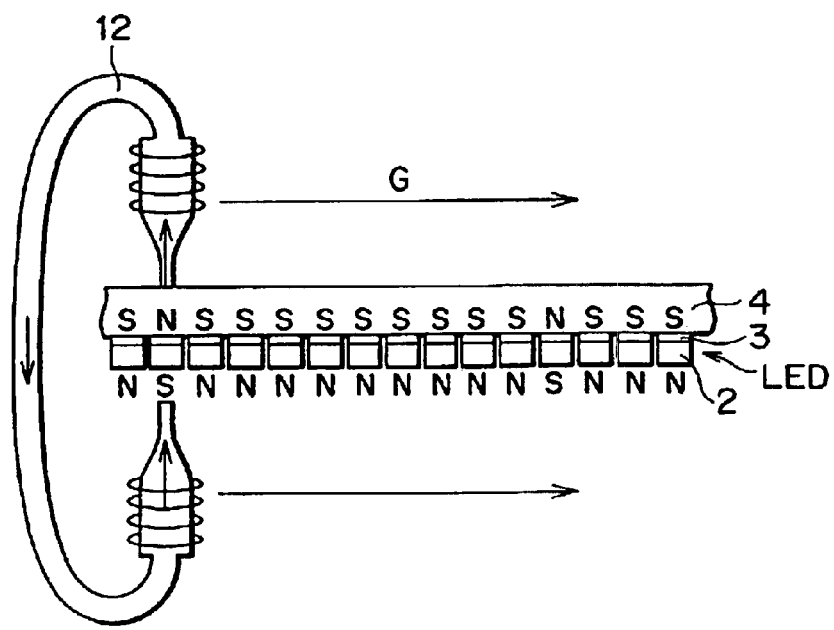

FIGS. 2A and 2B are schematic views illustrating one example of the selective magnetization step shown in FIG. 1E. Referring to FIG. 1E, all of the LED pellets are uniformly magnetized. To be more specific, the array of the LEDs transferred onto the temporary board 4 are held between a pair of upper and lower permalloy boards 10, and a pair of magnetization heads 11 configured as electric magnets are disposed on the upper and lower sides of the permalloy boards 10. A magnetic force is applied from the magnetization heads 11 to the array of the LEDs via the permalloy boards 10, to thereby uniformly magnetize the magnetic film portions 3 formed on all of the LEDs in the downward direction with the upper sides thereof taken as the S-poles and the lower sides thereof taken as the N-poles. Subsequently, as shown in FIG. 2B, the magnetized direction of only the selected LEDs is changed from the downward direction to the upward direction by using a magnetization head 12 configured as a probe type electric magnet. The probe type magnetization head 12 is stepwise scanned at the specific intervals of G in order to give a magnetic force only to the selected LEDs. It is to be noted that an array type magnetization head having an array of head portions corresponding to the array of the selected LEDs may be used in place of the probe type magnetization head 12. In this embodiment, the non-selected LEDs are vertically magnetized in the downward direction while the selected LEDs are vertically magnetized in the opposed direction, that is, in the upward direction; however, the non-selected LEDs may be vertically magnetized in the upward direction while the selected LEDs be vertically magnetized in the downward direction. Alternatively, only the selected LEDs may be vertically magnetized with the non-selected LEDs left non-magnetized. With such magnetization, it is possible to transfer only the selected LEDs on the mounting board side by magnetic attraction.

In the example shown in FIGS. 2A and 2B, the magnetic film portion formed on each LED is vertically magnetized by the magnetization heads disposed on the front and back surface sides of the LED. In place of this configuration, as shown in FIG. 3, a single magnetization head 13 for vertically magnetizing the magnetic film portion 3 formed on each LED may be disposed on one of the front and back surface sides of the LED.

Figure 3:
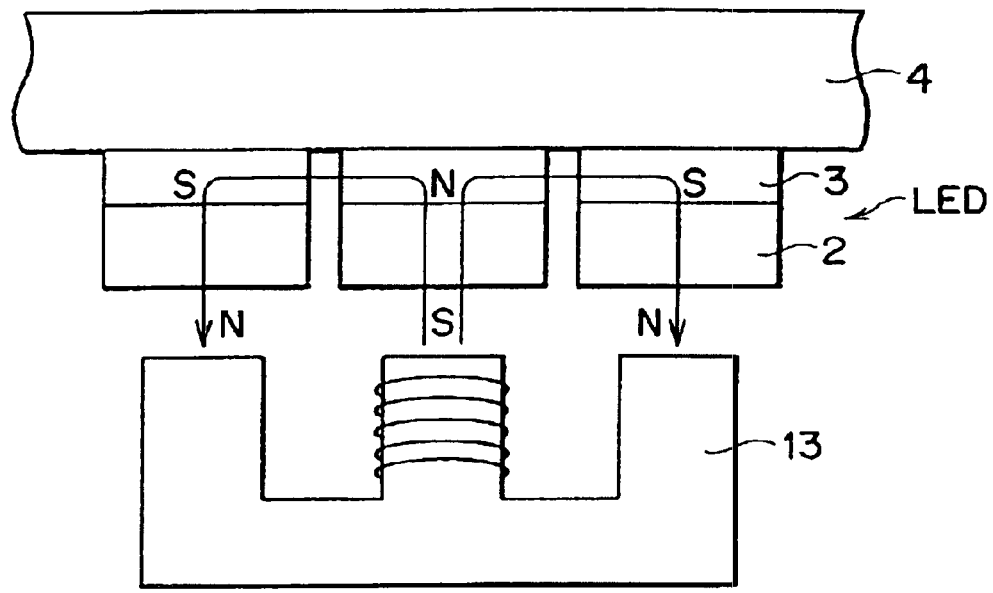
FIG. 3 is a schematic view showing one example of a magnetization head used for carrying out the production method of the present invention.
Figure 4:
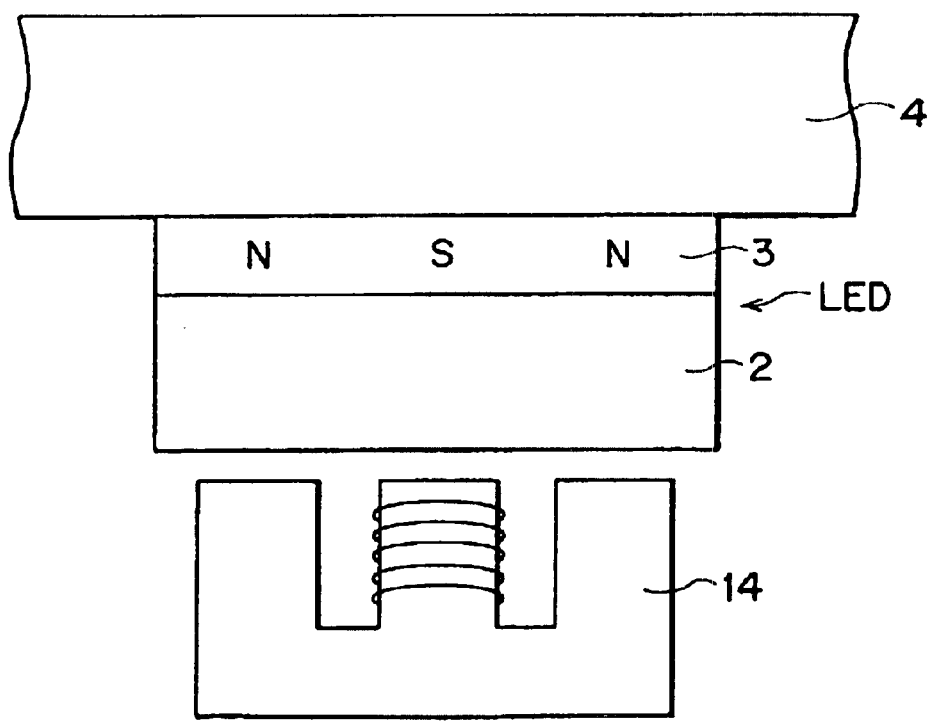
FIG. 4 is a schematic view showing another example of the magnetization head used for carrying out the production method of the present invention.

FIG. 4 is a schematic view illustrating a horizontal magnetization method using a magnetization head similar to that shown in FIG. 3. In the example shown in FIG. 4, a magnetic force is applied to the magnetic film portion 3 formed on each LED by a ring-shaped magnetization head 14, so that a central portion of the magnetic film portion 3 is magnetized into the S-pole and a ring-shaped portion surrounding the central portion of the magnetic film portion 3 is magnetized into the N-pole. Such horizontal magnetization is performed for all of the LEDs. Thereafter, a magnetic force is applied again to each of the selected LEDs by the magnetization head 14. In this case, by reversing the current supplied to a coil wound around the magnetization head 14, each of the selected LED can be magnetized in such a manner as to be magnetically distinguishable from the surrounding non-selected LEDs. To be more specific, the central portion of the magnetic film portion on the selected LED can be magnetized into the N-pole while the magnetic film portion on each of the surrounding non-selected LEDs be magnetized into the S-pole. The selected LEDs are thus magnetically distinguishable from the non-selected LEDs.

Figure 5A:
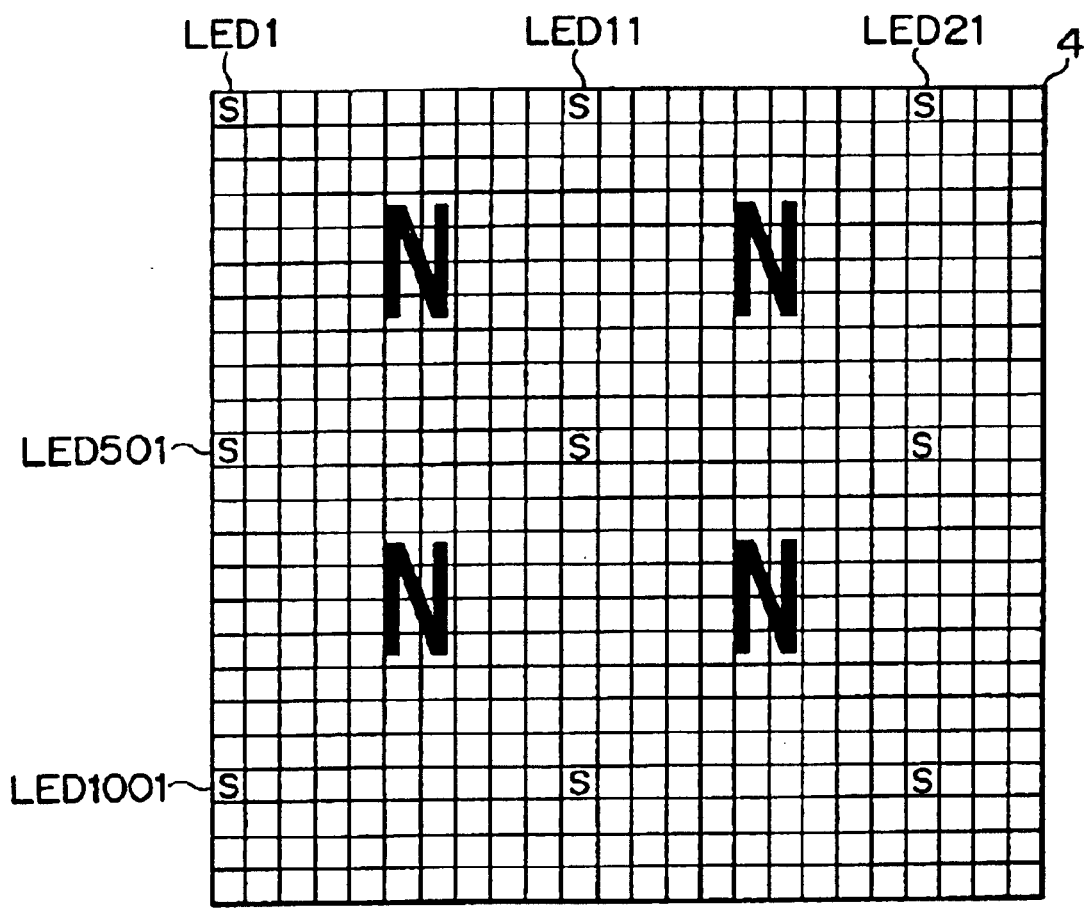
FIGS. 5A and 5B are a plan view and a side view schematically showing a selective magnetization state, respectively.
Figure 5B:
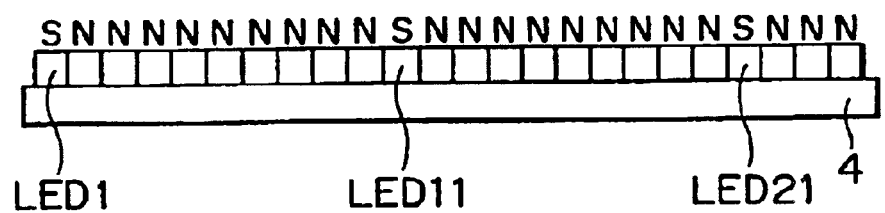

FIGS. 5A and 5B are schematic plan and side views showing a selective magnetization state of an array of LEDs, respectively. Referring to these figures, of an array of LEDs transferred on the temporary board 4, only the selected LEDs are magnetized in the selective magnetization step in such a manner as to be magnetically distinguishable from the surrounding non-selected LEDs. For example, the upper surface sides of the non-selected LEDs are magnetized into the N-poles, while the upper surface sides of the selected LEDs are magnetized into the S-poles. In the example shown in FIGS. 5A and 5B, only the LEDs spaced from each other at intervals of 10 pieces in both the row and column directions, that is, LED1, LED11, LED21, . . . , LED501, . . . , LED1001, . . . are selected and are transferred from the temporary board 4 to a mounting board (not shown). By repeating such selective magnetization, all of the LEDB can be transferred onto the mounting board in such a manner as to be two-dimensionally enlarged at the specific intervals G=20×D. In this example, the enlargement ratio is 10 times. This enlargement ratio can be generally set to a desired integer-fold.

Figure 6A:
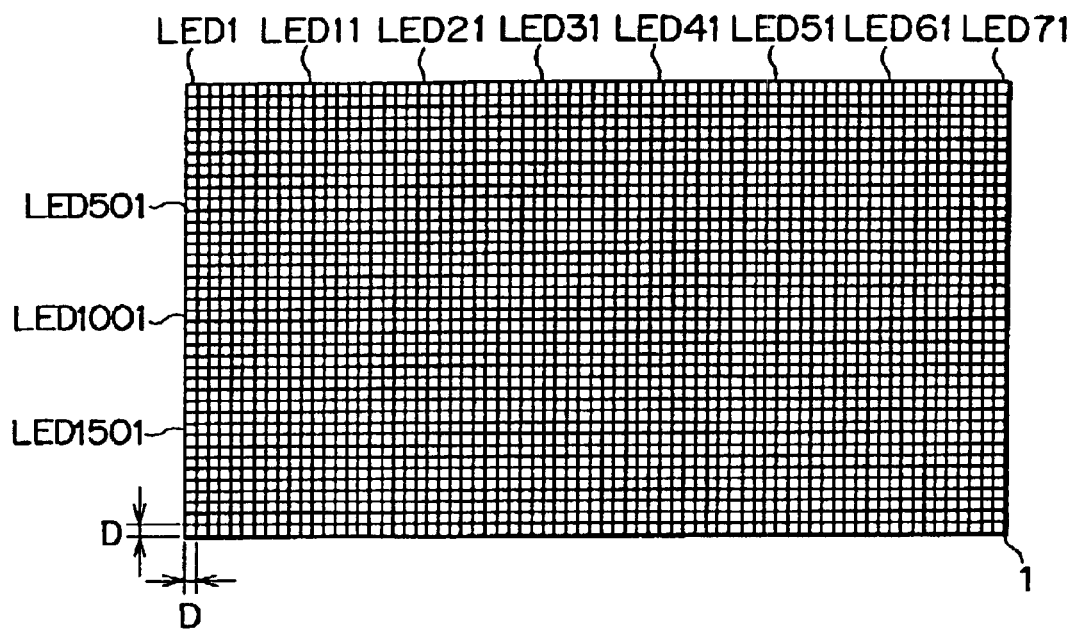
FIGS. 6A and 6B are plan views schematically showing the image display unit of the present invention.
Figure 6B:
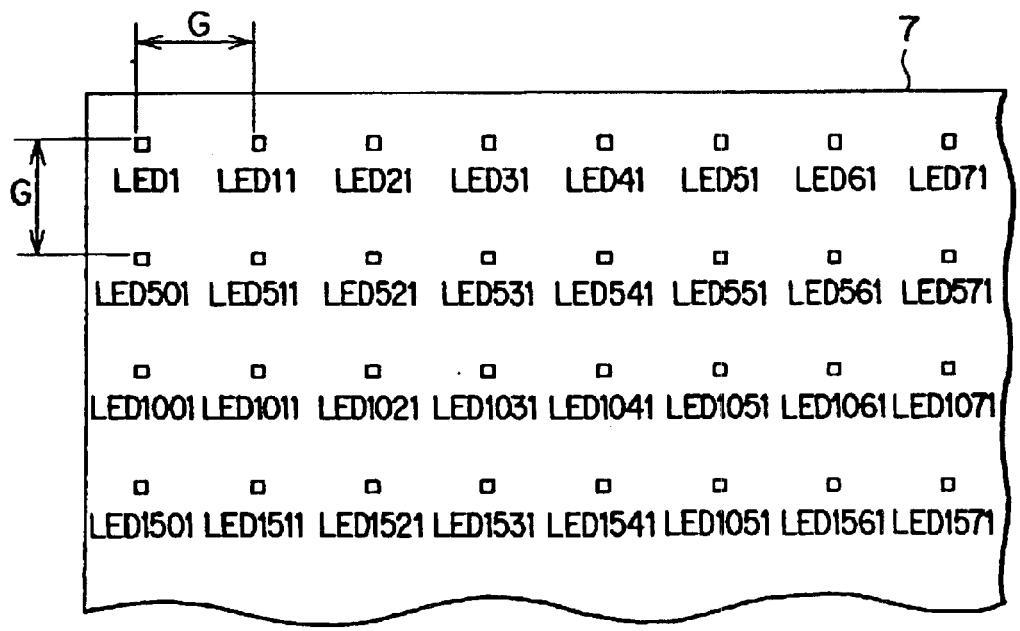
Figure 7A:
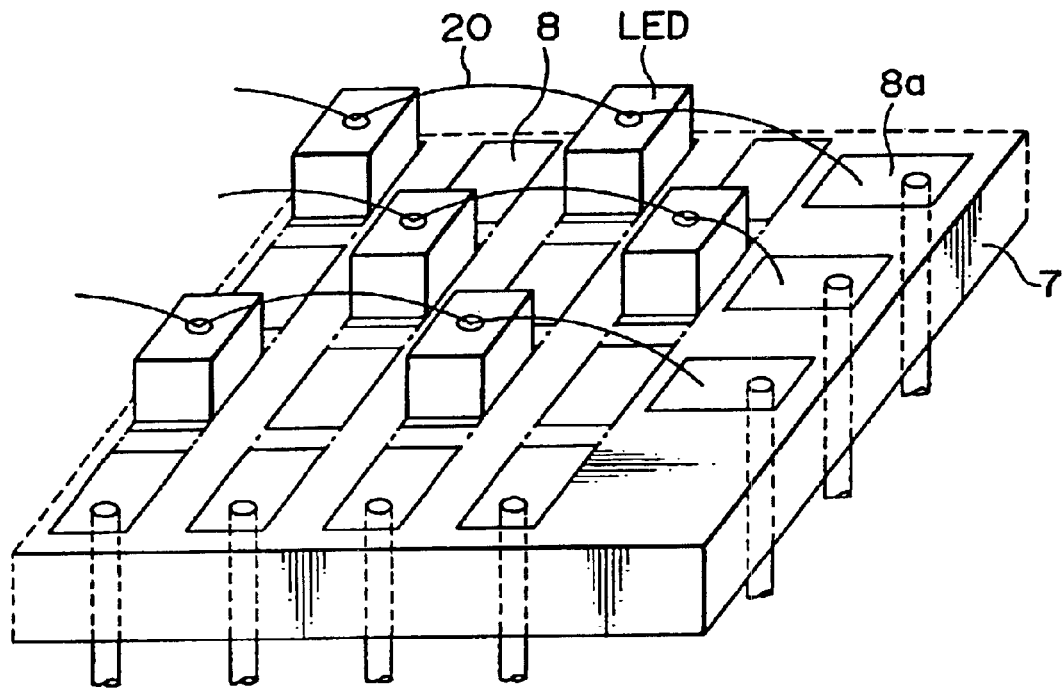
FIGS. 7A and 7B are schematic views showing one example of a related art image display unit.
Figure 7B:
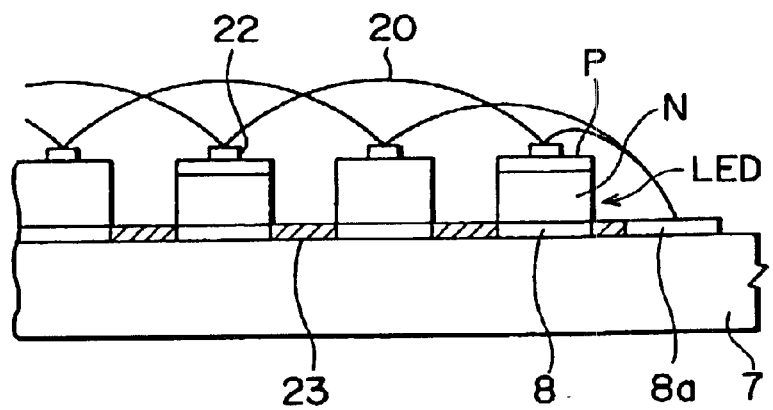
Figure 8A:
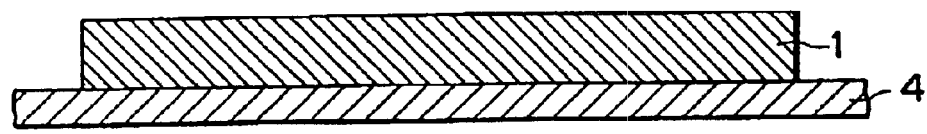
FIGS. 8A to 8E are views illustrating process steps of producing the related art image display unit.
Figure 8B:
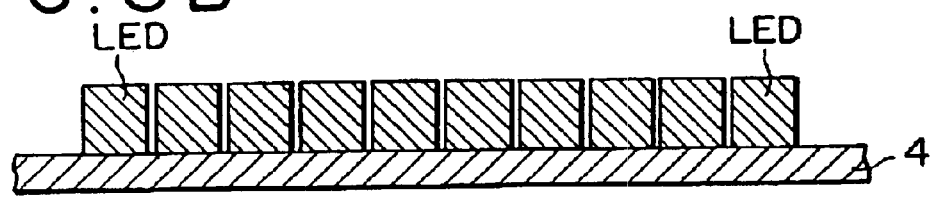
Figure 8C:
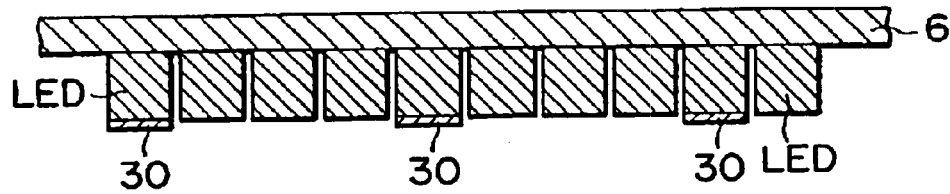
Figure 8D:
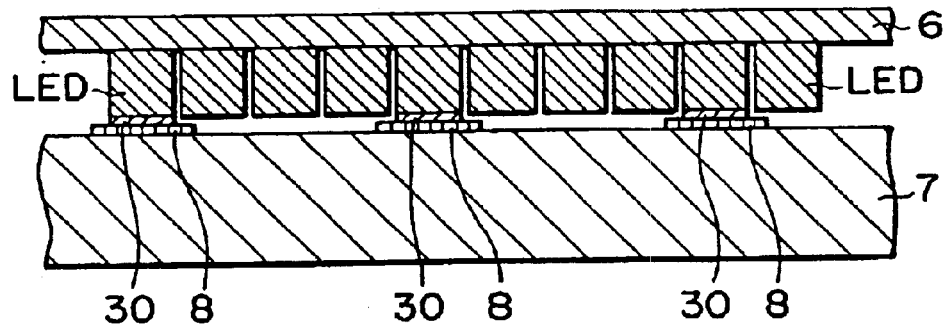
Figure 8E:
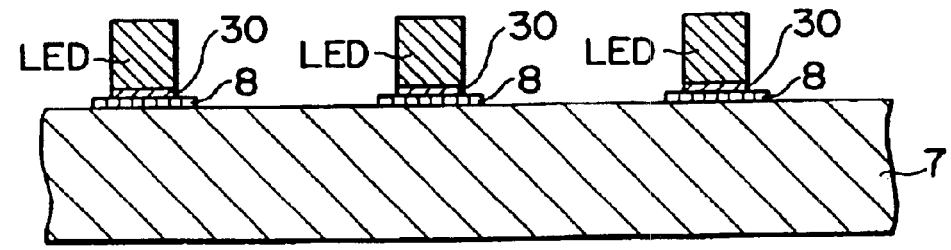

FIGS. 6A and 6B are schematic views comparatively showing an array of LEDs integratedly formed on a wafer (FIG. 6A) and an array of the LEDs mounted on a mounting board (FIG. 6B). As shown in FIG. 6A, LEDs are densely integratedly formed on a wafer 1 on a specific cycle D by a semiconductor production process. The size of each LED is set, for example, to 0.1 mm×0.1 mm. By densely integratedly forming the LEDs on the wafer 1 as described above, the production cost of the LED pellets can be reduced.

As shown in FIG. 6B, the LEDs mounted on a mounting board 7 are arrayed at specific intervals of, for example, G=10×D in a matrix pattern. FIG. 6B shows only part of the mounting board 7. In actual, the mounting board 7 has a length being ten times as large as the length of the wafer 1. FIGS. 6A and 6B show a state in which only LED1, LED11, . . . initially selected from the array of all of the LEDs on the wafer 1 are transferred to the corresponding positions of the mounting board 7. The selection of the LEDs is repeated by ten times in the row direction and is repeated by ten times in the column direction. That is to say, by repeating the selection and transfer of the LEDs by 100 times in both the row and column directions, all of the LEDs can be enlargedly transferred from the wafer 1 to the mounting board 7. Of course, the area of the mounting board 7 is as large as 100 times the area of the wafer 1. With this method, it is possible to simultaneously array a plurality of small-sized LED chip, on a circuit board and hence to produce a high definition image display unit at a relatively low cost. In particular, since the LEDs are discretely selected from the whole LEDs, which are densely arrayed on the wafer, by one selected and transfer, variations in operational characteristic of the selected LED chips are equalized to each other, and since the LEDs thus selected with their variations equalized to each other are transferred to the mounting board 7, variations in operational characteristic of the LEDs transferred on the mounting board 7 are also equalized to each other. As a result, local differences in power consumption among the individual LEDs is eliminated, to reduce a variation in temperature of the overall board 7. Further, since the selected LEDs can be transferred on the mounting board 7 while the dimensional accuracy of each of the LEDs in the state being formed on the wafer is kept, it is possible to realize a high mounting accuracy. According to this method, the individual LEDs are not required to be subjected to accurate positional adjustment on the mounting board 7, that is, the individual LEDs may be subjected simple positional adjustment relative to the board in each selection and transfer step, with a result that it is possible to reduce time and effort required for positional adjustment of the LEDs in mounting of the LEDs.

As described above, according to the present invention, since LED pellets are enlargedly transferred from a wafer to a mounting board by using magnetic attraction, it is possible to produce a high definition 2 image display unit at a low cost. Further, since it is not required to perform the positional adjustment of individual LEDs on a mounting board, it is possible to reduce time and effort required for positional adjustment of the LEDs on the mounting board. In addition, since variations in operational characteristic of individual LEDs on a mounting board are equalized to each other, it is possible to equalize a power consumption distribution over the mounting board and hence to eliminate a variation in temperature of the mounting board.

What is claimed is:

1. An image display unit comprising:

display elements mounted on a mounting board;

wherein the mounting of said display elements is carried out by a manner of:

forming, on a wafer, a display element layer composed of said display elements arrayed on a specific cycle and provided with a magnetic film, and separating the display element layer into said display elements with magnetic film portions individually separated from the magnetic film while keeping the array of said display elements;

selecting, of all of said display elements, those located discretely at specific intervals of a value equivalent to an integer-fold of the specific cycle, and magnetizing the magnetic film portions provided on said selected display elements in such a manner that the magnetic film portions provided on said selected display units are magnetically distinguishable from the magnetic film portions provided on the non-selected display elements; and magnetically attracting said selected display elements while keeping the specific intervals thereof, and transferring said selected display elements onto said mounting board.

2. An image display unit according to claim 1, wherein all of said display elements are arrayed at the specific intervals on said mounting board by repeating the selection, magnetization, attraction, and transfer steps.

3. An image display unit according to claim 1, wherein the magnetic film portions on all of said display elements are magnetized in one direction, and then the magnetic film portions on said selected display elements are re-magnetized in the opposed direction.

4. An image display unit according to claim 1, wherein only said selected display elements are magnetically attracted by using an electric magnet.

5. An image display unit according to claim 1, wherein said display elements which are composed of light emitting diodes located on the front surface sides taken as light emitting sides are formed on the wafer, and the magnetic film is formed on the back surface sides of said display elements.

6. An image display unit according to claim 5, wherein a magnetic film is formed even on portions, not obstructing light emission, of the front surfaces of the light emitting diodes, and magnetic film portions individually separated from the magnetic film formed on the light emitting diodes are magnetically connected to the magnetic film portions formed on the back surface sides of said display elements.

7. An image display unit according to claim 1, wherein after said display elements are arrayed on said mounting board, the magnetization of the magnetic film portions on said display elements is eliminated.

* * * * *